(12) United States Patent
Amaducci et al.

(10) Patent No.: US 12,294,346 B2
(45) Date of Patent: May 6, 2025

(54) ELECTROMAGNETIC INTERFERENCE FILTER HAVING CONTROLLED IMPEDANCE MAGNITUDE

(71) Applicant: Schaffner EMV AG, Luterbach (CH)

(72) Inventors: Alessandro Amaducci, Deitingen (CH); Enrico Mazzola, Gerlafingen (CH)

(73) Assignee: Schaffner EMV AG, Luterbach (CH)

( * ) Notice: Subject to any disclaimer, the term of this patent is extended or adjusted under 35 U.S.C. 154(b) by 507 days.

(21) Appl. No.: 17/670,311

(22) Filed: Feb. 11, 2022

(65) Prior Publication Data
US 2022/0263486 A1 Aug. 18, 2022

(30) Foreign Application Priority Data
Feb. 18, 2021 (EP) .................... 21157900

(51) Int. Cl.
H03H 7/06 (2006.01)
H03H 1/00 (2006.01)
H03H 7/01 (2006.01)

(52) U.S. Cl.
CPC ............ *H03H 7/06* (2013.01); *H03H 7/0115* (2013.01); *H03H 1/0007* (2013.01)

(58) Field of Classification Search
CPC .... H03H 1/0007; H03H 7/0115; H03H 11/04; H03H 7/06
USPC .................................. 333/12, 181, 213, 214
See application file for complete search history.

(56) References Cited

U.S. PATENT DOCUMENTS

| 2012/0235597 A1 | 9/2012 | Nerone |
| 2014/0312966 A1 | 10/2014 | Hoene et al. |
| 2018/0269781 A1 | 9/2018 | Amaducci |
| 2020/0044625 A1 | 2/2020 | Arndt et al. |

OTHER PUBLICATIONS

M. L. Heldwein, et al., "Implementation of a Transformerless Common-Mode Active Filter for Offline Converter Systems", IEEE Transactions on Industrial Electronics, vol. 57, No. 5, May 2010, 16 pgs.
A. Amaducci, "Design of a Wide Bandwidth Active Filter for Common Mode EMI Suppression in Automotive Systems", IEEE, 2017, 8 pgs.

*Primary Examiner* — Rakesh B Patel
(74) *Attorney, Agent, or Firm* — Blank Rome LLP

(57) ABSTRACT

Electromagnetic interference filter for suppressing interferences in a DC network, the network comprising a source device powering a load device via a bus connectable to the source device at an input side and to the load device at an output side.
The EMI filter being connected to the bus and comprising an active filter circuit having an active filter bandwidth and being configured to sense a noise component superimposed in the bus and inject a cancelling noise in the bus to suppress said noise component. The EMI filter further comprises a passive circuit including a source circuit connected to the bus at the input side and a passive load circuit to the bus connected at the output side, the passive circuit being configured to provide, at least at a cutoff frequency of the active filter bandwidth, a source impedance at the input side that differs from a load impedance at the output side by a factor of at least two.

14 Claims, 4 Drawing Sheets

ELECTROMAGNETIC INTERFERENCE FILTER HAVING CONTROLLED IMPEDANCE MAGNITUDE

REFERENCE DATA

The present application claims priority of European patent application EP21157900 of Feb. 18, 2021, the content whereof is entirely incorporated.

TECHNICAL DOMAIN

The present disclosure concerns an electromagnetic interference filter for suppressing an unwanted electromagnetic noise component superimposed on an electric supply line. In particular, the present invention concerns an active electromagnetic noise interference (EMI) filter having enhanced performances.

RELATED ART

Electric systems in vehicles and in industry are becoming ever more complex and include a multitude of components that generate, or are liable to be disturbed by, electromagnetic interferences. Electric motors, for example, are often driven by electronic inverters that control the motor speed and torque by generating waveforms with variable frequency and amplitude. These systems provide high efficiency but generate a powerful electromagnetic noise.

Switching power converters are used in electric and hybrid vehicles, as well as in countless other applications such as driving stationary motors, battery chargers, photovoltaic systems, lighting control, computers, and other. In all these cases, the switching action of the converter is a source of electromagnetic noise that could, if it is not managed or attenuated, affect the functioning of other systems, or exceed normative limits.

Electric or electronic filters used to attenuate these unwanted electromagnetic interferences, called EMI filters in short, are used in all branches of electric engineering to improve reliability and respect existing norms. Well-designed filtering system are essential to the performance of many complex electric systems.

Electric and hybrid vehicles are equipped with different power converters in a very tight space. This coexistence represents a serious electromagnetic problem and demands efficient EMI filtering. When the filters ae not enough to bring the noise to acceptable levels, shielded cables can be used, but they contribute significantly to costs.

It is known to use passive low-pass C-L filters to attenuate EMI. While passive solutions do offer substantial attenuation, they have their limits. Magnetic components rated for the current levels used in modern electric vehicles are bulky, expensive, heavy, and not always suitable for mass production.

Document US20180269781 discloses an active EMI filter for an electric vehicle. Active filters can be more compact than equivalent passive ones but providing a satisfactory active filter for the high-current wide-bandwidth interferences generated in electric vehicles is difficult.

FIG. 1 shows the working principle of an active filter. A load device 21 has a bus 15 for conducting the main currents. A source device 20 connected to the bus 15 with the load device 21 creates noise, in particular EMI. The noise flows on the bus 15 in the load device 21 as shown with the solid arrows. Although not shown, the noise flows back to the source device 20 over a ground connection. An active filter 22 between the source device 20 and the load device 21 creates a cancelling noise and injects the cancelling noise in the bus 15 to cancel the noise from the source device 20. Consequently, the noise is cancelled by the cancelling noise between the active filter 22 and the load device 21. The cancelling noise flows from the active filter 22 to the load device 21 and then over the ground connection back to the active filter 22.

FIG. 2 shows a simple active filter circuit representation implemented as a feedback current-sensing current-injecting circuit, whereby the active filter measures a noise current and injects a cancelling noise current. For the proper functionality, performance and stability of an active filter, the source impedance $Z_S$ and the load impedance $Z_L$ must be known.

The performance, i.e., the attenuation of a feedback current-sensing current-injecting active filter (called insertion loss, IL), is given by Equation 1:

$$IL = 1 + A\frac{Z_S}{Z_L + Z_S}, \quad (1)$$

where A is the filter gain. Equation 1 shows that each of the source impedance $Z_S$ and the load impedance $Z_L$ influences the attenuation of the active filter, such that they must be known and controlled.

Since in a real active filter circuit it is not always possible to know or measure exactly the source and load impedances $Z_S$, $Z_L$ in the working frequency $F_W$ range of the active filter, there is a need to control the source and load impedance $Z_S$, $Z_L$ such as to guarantee a stable operation of the active filter. To maximize the attenuation of the feedback current-sensing current-injecting active filter, the source and load impedances $Z_S$, $Z_L$ should have the same magnitude ratio over frequency. In this case, the source impedance $Z_S$ should be greater than the load impedance $Z_L$.

For a voltage-sensing voltage-injecting circuit configuration of the active filter, insertion Loss, IL is given by Equation 2:

$$IL = 1 + A\frac{Z_L}{Z_L + Z_S}, \quad (2)$$

and the attenuation is maximized when the load impedance $Z_L$ is greater than the source impedance $Z_S$.

SUMMARY

An aim of the present invention is the provision of an EMI filter that overcomes the shortcomings and limitations of the state of the art.

The present disclosure concerns an EMI filter destined to cooperate with a DC or an AC network comprising a source device powering a load device via a bus, that can be an AC or DC bus. The bus being connectable to the source device at an input side and to the load device at an output side. The EMI filter being connected to and/or being a part of the bus and comprises an active filter circuit having an active filter bandwidth and being configured to sense a noise component superimposed in the bus at the input side traveling towards the output side and inject a cancelling noise in the bus to suppress said noise component. The EMI filter further comprises a passive circuit including a source circuit connected to the bus at the input side and a passive load circuit to the bus connected at the output side, the passive circuit being configured to provide, at least at a cutoff frequency of the active filter bandwidth, a source impedance at the input side that differs from a load impedance at the output side by a factor of at least two.

The EMI filter disclosed herein provides a minimum, or maximum, impedance magnitude at least at a cutoff frequency and/or at every working frequency of the active filter bandwidth, so that the desired performance is achieved. The EMI filter guarantees proper functionality of the electronic circuit, without saturation of the active circuit and/or instability. The EMI filter can be configured with more than one cutoff frequencies.

The cutoff frequency or corner frequency is well known in electrical engineering. It often corresponds to the frequency above or below which the power output of an amplifier or electronic filter has fallen to a given proportion, often referred to as the 3 dB point, of the power in the passband. An amplifier circuit or electronic filter can have more than one frequency. Active bandpass filter circuits, for example, are often configured with two cutoff frequencies.

The EMI filter can function in different DC or AC networks, without the need of being fine-tuned to each single application, i.e., different converters or different setups having unknown source and load impedances.

The EMI filter can further avoid the saturation of the active filter electronic circuit. The EMI filter guarantees a stable and desired values of the source and load impedances, assuring the stability of the EMI filter and increase the performance in the working frequency band.

SHORT DESCRIPTION OF THE DRAWINGS

Exemplar embodiments of the invention are disclosed in the description and illustrated by the drawings in which.

EXAMPLES OF EMBODIMENTS

Figure 1:
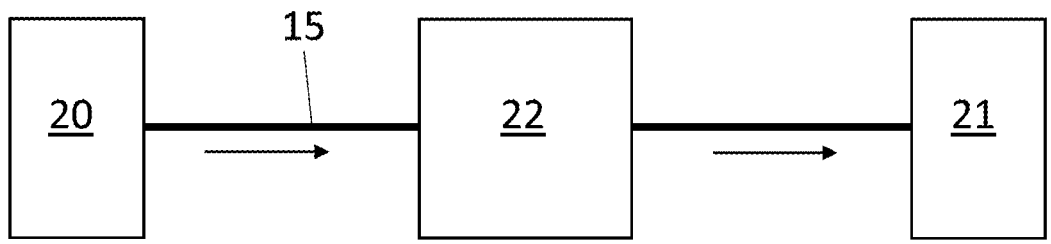
FIG. 1 shows the working principle of an active filter.
Figure 2:
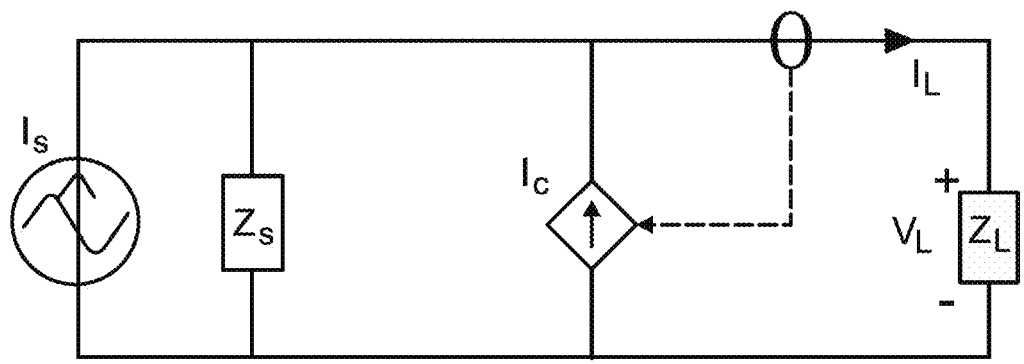
FIG. 2 shows an active filter circuit representation implemented as a feedback current-sensing current-injecting circuit.
Figure 3:
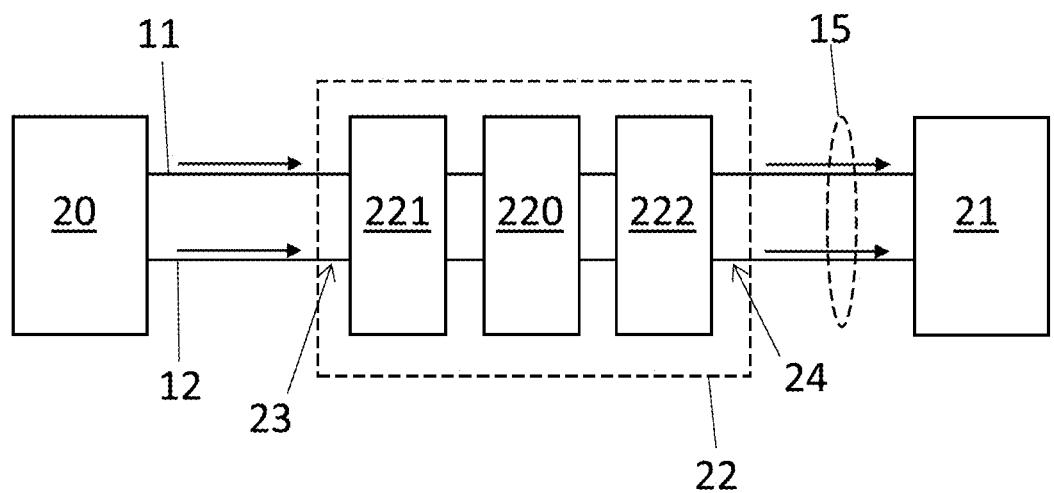
FIG. 3 illustrates an EMI filter comprising a passive circuit, according to an embodiment.

With reference to FIG. 3, an EMI filter 22 is shown according to an embodiment. The EMI filter 23 is destined to cooperate with a DC network comprising a source device 20 powering a load device 21 via a DC bus 15. The DC bus 15 is connected to the source device 20 at an input side 23. Here, the term "input" substantially means "at the side of the source device 20". The DC bus 15 is further connected to the load device 21 at an output side 24. Here, the term "output" substantially means "at the side of the load device 21". The EMI filter 22 is connected to the DC bus 15 and/or is forming a part of the DC bus 15. The EMI filter 22 comprises an active filter circuit 220 having an active filter bandwidth and configured to sense a noise component superimposed in the DC bus 15 at the input side 23 and inject a cancelling noise in the DC bus 15 to suppress said noise component. The noise component travels from the input side 23 towards the output side 24.

The EMI filter 22 further comprises a passive circuit 221, 222 including a passive source circuit 221 connected at the input 23 and a passive load circuit 222 connected at the output side 24. The passive circuit 221, 222 is configured to provide, at least at a cutoff frequency $F_C$ of the active filter bandwidth, a source impedance $Z_S$ at the input side 23 that differs from a load impedance $Z_L$ at the output side 24 by a factor of at least two, more preferably of at least 10. Alternatively, or in addition the passive circuit 221, 222 is configured to provide, at each working frequency $F_W$ of the active filter bandwidth, a source impedance $Z_S$ at the input side 23 that differs from a load impedance $Z_L$ at the output side 24 by a factor of at least two, more preferably of at least 10.

The active filter bandwidth is between 10 kHz and 10 MHz.

The passive source circuit 221 can be further configured to adjust the magnitude of the noise component such as to avoid saturation of the active filter circuit 220. For this sake the passive source circuit 221 is configured to adjust the magnitude of the noise component such that a peak-to-peak voltage of the noise component between the passive source circuit 221 and the active filter circuit 220 is smaller than a maximum output voltage and/or capability of the active filter circuit 220.

In one aspect, the passive source circuit 221 is configured to adjust the magnitude of the noise component below 300 mA. More generally, knowing the noise disturbance coming from the source device 20 and the maximum current/voltage capabilities of the active filter circuit 220, the passive source circuit 221 can be configured to adjust the current/voltage compensation capabilities of the active filter circuit 220, in other words, such that the noise disturbance is reduced in amplitude to fulfil the maximum capabilities of the active filter circuit 220. For example, the passive source circuit 221 can be configured to adjust the magnitude of the noise component by a factor of at least five times. In particular, if the noise coming from the source device 20 has current peaks of 5 A and the active filter circuit 220 can source/sink maximum 1 A, the passive source circuit 221 is designed to reduce the current peaks at least to 1 A.

In an embodiment, the active filter circuit 220 comprises a current-sensing current-injecting active filter. The passive circuit 221, 222 is configured such that, at least at a cutoff frequency $F_C$ the source impedance $Z_S$ is at least two times, more preferably at least 10 times greater than the load impedance $Z_L$. Alternatively, or in addition, the passive circuit 221, 222 is configured such that at each working frequency $F_W$ of the active filter bandwidth, the source impedance $Z_S$ is at least two times, more preferably at least 10 times greater than the load impedance $Z_L$.

In one aspect, the passive source circuit 221 can include a n-order passive filter, wherein n is 2 or greater.

Figure 4:
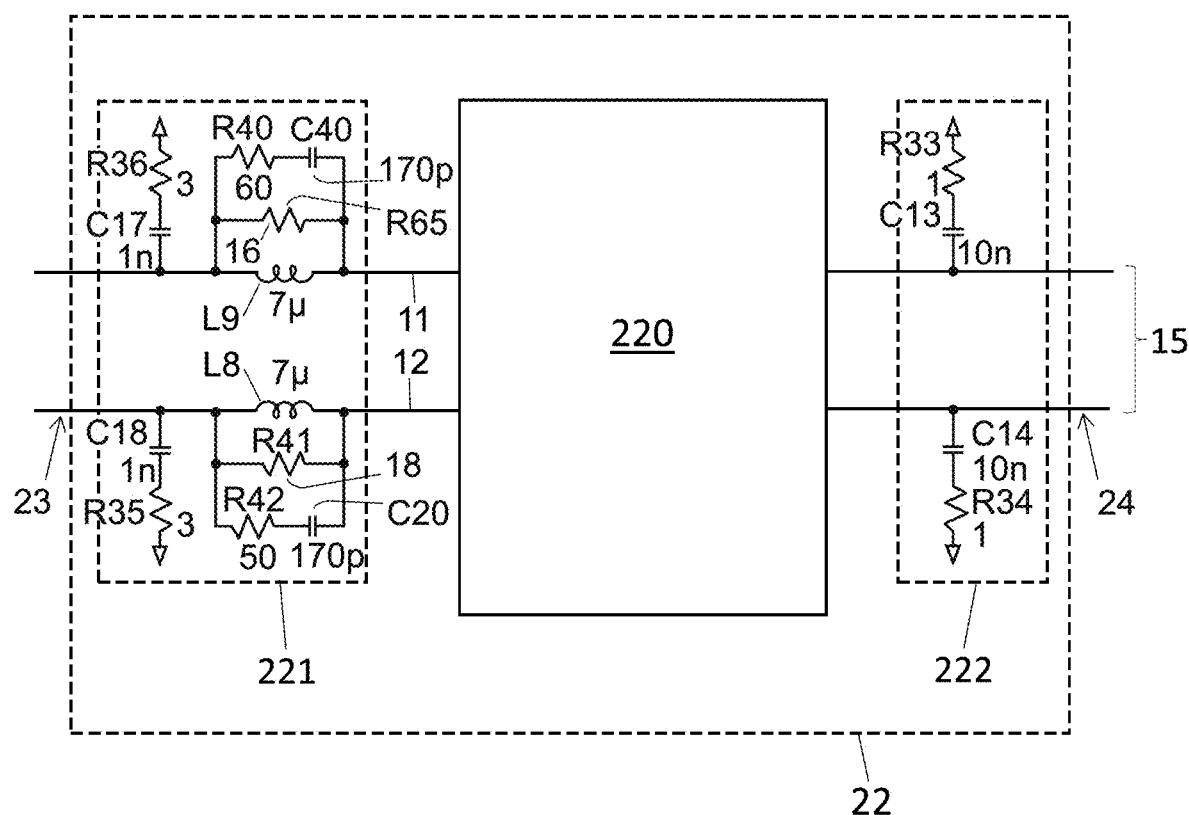
FIG. 4 illustrates a possible configuration of the passive circuit, according to an embodiment.

FIG. 4 illustrates a possible configuration of the passive circuit 221, 222 including the source circuit 221 connected at the input side 23 and the passive load circuit 222 connected at the output side 24, according to an embodiment. As shown if FIG. 4, the passive source circuit 221 can comprise a C-L circuit including at least a source capacitance $C_S$, a source inductance $L_S$ and a source damping resistor $R_s$. For example, the passive source circuit 221 can comprise a C-L circuit including at least a source capacitance $C_S$, a source inductance $L_S$ and a source damping resistor $R_s$ connected to the DC bus 15.

As shown in FIG. 4, the DC bus 15 can comprise a first power conductor 11 and a second power conductor 12. In such configuration, the C-L circuit including at least a source capacitance $C_S$, a source inductance $L_S$ and a source damping resistor $R_s$ can be connected to each of the first and second power conductors 11, 12.

In one aspect, the source damping resistor $R_s$ is equal or smaller than 3Ω.

In one aspect, the passive source circuit 221 can comprise a source capacitance $C_S$ of about 1 nF and a source inductance $L_S$ of about 7 μH.

The passive load circuit 222 can include at least a single passive component $C_L$, $L_L$ and a load damping resistor $R_L$. For example, the passive load circuit 222 can include at least a single passive component $C_L$, $L_L$ and a load damping resistor $R_L$ connected to the DC bus 15. As shown in FIG. 4, the DC bus 15 can comprise a first power conductor 11 and a second power conductor 12. In such configuration, the passive load circuit 222 can be connected to each of the first and second power conductors 11, 12.

In one aspect, the passive load circuit 222 can include at a load capacitance $C_L$ of about 20 nF and a load damping resistor $R_L$ of about 1Ω.

The elements or components as described before might be formed/lumped by the individual electric elements or components, as illustrated in FIG. 4.

Figure 5:
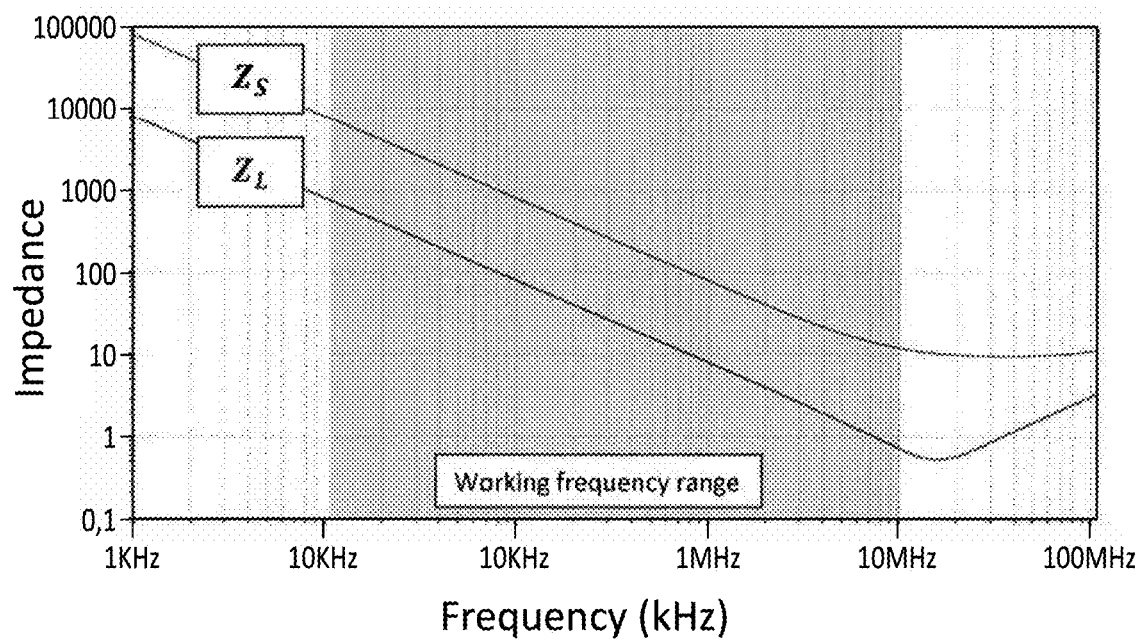
FIG. 5 shows a graph of the source impedance and the load impedance plotted as a function of the working frequency of the active filter circuit of FIG. 4.

FIG. 5 shows a graph of the source impedance $Z_S$ and the load impedance $Z_L$ plotted as a function of the working frequency $F_W$ of the active filter circuit 220 of FIG. 4. The active filter bandwidth is indicated by the grey area on the graph, whereas the cutoff frequency $F_C$ is not shown. The active filter circuit 220 may be arranged with multiple cutoff frequencies $F_C$.

In another embodiment, the active filter circuit 220 comprises a voltage-sensing voltage-injecting active filter. The passive load circuit 222 can be configured such that, at least at a cutoff frequency $F_C$ a load impedance $Z_L$ is at least two times, more preferably at least 10 times greater than the source impedance $Z_S$. Alternatively, or in addition, the passive circuit 221, 222 is configured such that at each frequency of the active filter bandwidth, a load impedance $Z_L$ is at least two times more preferably at least 10 times greater than the source impedance $Z_S$.

Figure 6:
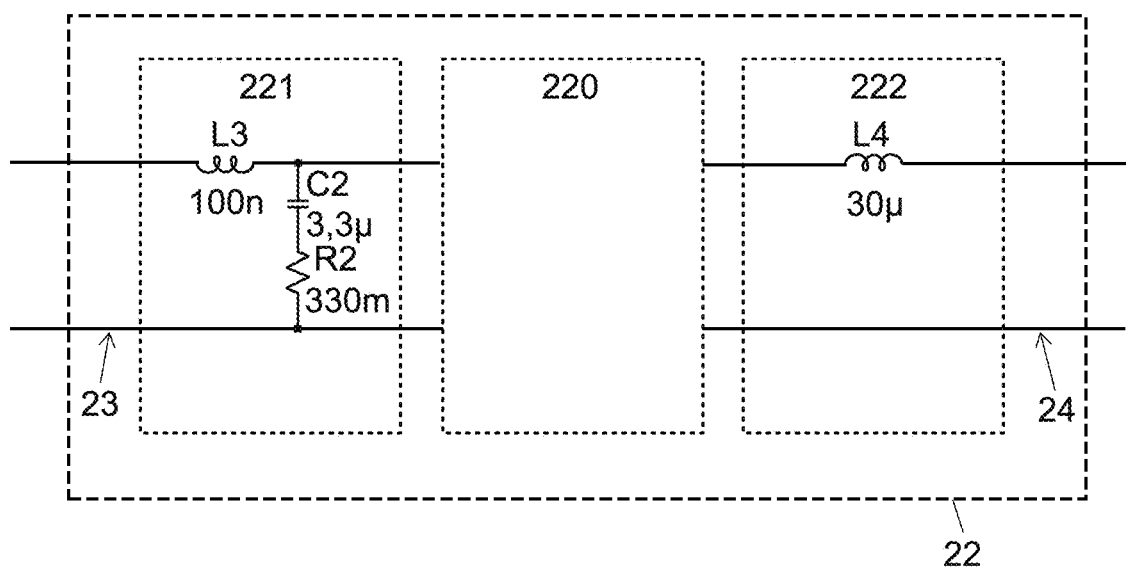
FIG. 6 illustrates a possible configuration of the passive circuit, according to another embodiment.

FIG. 6 schematically shows an example of such an active filter circuit 220 comprising a voltage-sensing voltage-injecting active filter including a passive source circuit 221 connected at the input side 23 and a passive load circuit 222 connected at the output side 24. The general description of the circuit is the same as for the current-sensing current-injecting of FIG. 4, i.e., a second or higher order filter at source side and a single component filter at load side. For example, the passive source circuit 221 can comprise a C-L circuit including a source capacitance $C_S$ (for example being about 3.3 uF), a source inductance $L_S$ (for example being about 100 nH) and a damping resistor $R_s$ smaller than 1 Ohm. The passive load circuit 222 can include a single inductance, e.g., 30 uH. The configuration of the EMI filter 22 shown in FIG. 6 allows for achieving load impedance $Z_L$ is at least two times, more preferably at least 10 times greater than the source impedance $Z_S$. at least at a cutoff frequency $F_C$ and/or in the working frequency of the active filter, i.e., 10 kHz-10 MHz.

The elements or components as described before might be formed/lumped by the individual electric elements or components, as illustrated in FIG. 6.

Figure 7:
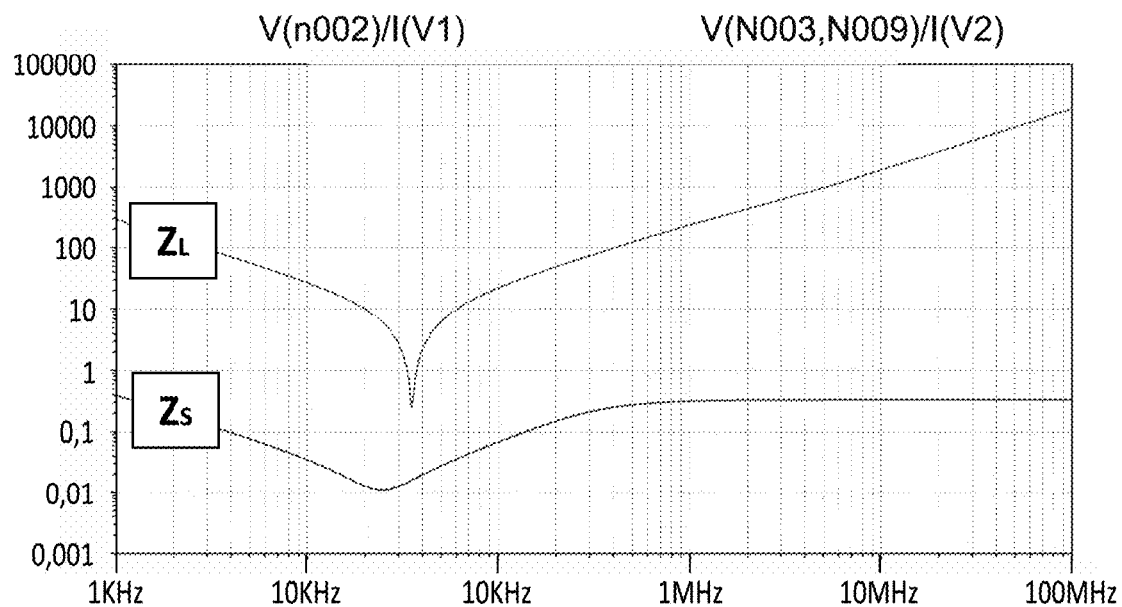
FIG. 7 shows a graph of the source impedance and the load impedance plotted as a function of the working frequency of the active filter circuit of FIG. 6.

FIG. 7 shows a graph of the source impedance $Z_S$ and the load impedance $Z_L$ plotted as a function of the working frequency $F_W$ of the active filter circuit 220 of FIG. 6, whereas the cutoff frequency $F_C$ is not shown. The active filter circuit 220 may be arranged with multiple cutoff frequencies $F_C$.

The passive circuit 221, 222 is configured to provide, at a cutoff frequency $F_C$ of the active filter bandwidth, a source impedance $Z_S$ that differs from a load impedance $Z_L$ by a factor of at least two, more preferably of at least ten. Alternatively, or in addition the passive circuit 221, 222 is configured to provide, at each frequency of the active filter bandwidth, a source impedance $Z_S$ that differs from a load impedance $Z_L$ by a factor of at least two, more preferably of at least ten. The passive circuit 221, 222 is arranged to adjust the magnitude of the noise component such as to avoid saturation of the active filter circuit 220, regardless of the configuration of the active filter 220. For this sake the passive source circuit 221 is configured to adjust the magnitude of the noise component such that a peak-to-peak voltage of the noise component between the passive source circuit 221 and the active filter circuit 220 is smaller than a maximum output voltage and/or current capability of the active filter circuit 220.

For example, the active filter 220 can comprises a current-sensing current-injecting active filter, a voltage-sensing current-injecting active filter, a current-sensing voltage-injecting or a voltage-sensing voltage-injecting active filter.

In yet another embodiment, at least one capacitance can be provided between the first and second power conductors 11, 12 between the source device 20 and the EMI filter 22, such as to equalize the impedance seen from each power conductors 11, 12 to ground. In the EMI filter 22 illustrated in FIG. 8, a capacitance $C_2$ is added between the two power conductors 11, 12 on the side of the passive source circuit 221. Here, the passive source circuit 221 and the passive load circuit 222 are similar to the ones shown in FIG. 4.

Figure 8:
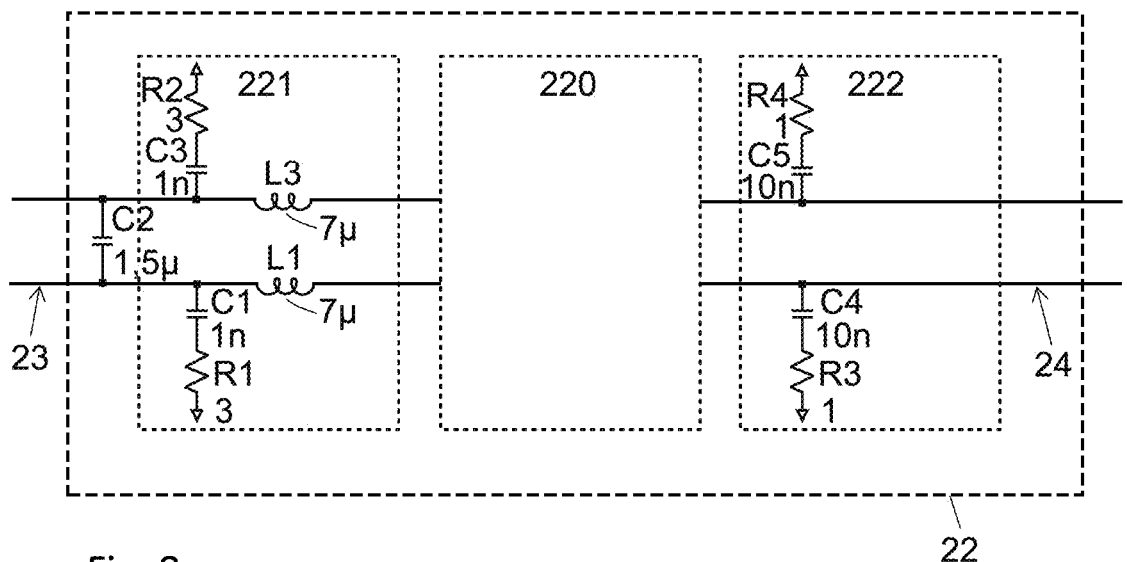
FIG. 8 illustrates the EMI filter, according to another embodiment.

The elements or components as described before might be formed/lumped by the individual electric elements or components, as illustrated in FIG. 8.

The EMI filter 22 can be placed in a motor drive unit on a DC power bus or on the AC side, in an electric vehicle, although this is not the only application of the present disclosure. The same inventive filter structure is suitable for suppressing interferences in DC networks as well as for suppressing interferences in AC networks. Other applications of the EMI filter 22 can include input or output of DC/DC converters and on-board chargers, for example in a vehicle.

REFERENCE NUMERAL USED IN THE FIGURES

11 first power conductor
12 second power conductor
15 DC bus, bus
20 source device
21 load device
22 electromagnetic interference (EMI) filter
220 active filter circuit
221 passive source circuit
222 passive load circuit
23 input side
24 output side A filter gain
$B_F$ active filter bandwidth
$C_L$ load capacitance
$C_S$ source capacitance
$C_2$ capacitance
$F_C$ cutoff frequency
$F_W$ working frequency
IL insertion Loss
$L_L$ load inductance
$L_S$ source inductance
$R_L$ load damping resistor
$R_S$ source damping resistor
$Z_S$ source impedance
$Z_L$ load impedance

The invention claimed is:

1. An electromagnetic interference (EMI) filter for suppressing interferences in a DC network, the network comprising:
a source device powering a load device via a bus connectable to the source device at an input side and to the load device at an output side;
the EMI filter being connected to the bus and comprising an active filter circuit having an active filter bandwidth and being configured to sense a noise component superimposed in the bus at the input side traveling towards the output side and inject a cancelling noise in the bus to suppress said noise component;
wherein the EMI filter further comprises a passive circuit including a passive source circuit connected to the bus at the input side and a passive load circuit connected to the bus at the output side, the passive circuit being configured to provide, at each frequency of the active filter bandwidth, a source impedance at the input side that differs from a load impedance at the output side by a factor of at least two.

2. An EMI filter according to claim 1, connected to the bus that is a DC bus or an AC bus.

3. An EMI filter according to claim 1,
wherein the active filter circuit is a current-sensing current-injecting active filter; and
wherein the passive circuit is configured such that, the source impedance is at least 10 times greater than the load impedance.

4. An EMI filter according to claim 1,
wherein the active filter circuit is a voltage-sensing voltage-injecting active filter; and
wherein the passive circuit is configured such that the load impedance is at least 10 times greater than the source impedance.

5. An EMI filter according to claim 1,
wherein the active filter bandwidth is between 10 kHz and 10 MHz.

6. An EMI filter according to claim 1,
wherein the passive source circuit is configured to adjust the current/voltage compensation capabilities of the active filter circuit.

7. An EMI filter according to claim 6,
wherein the passive source circuit is configured to adjust the magnitude of the noise component such that a peak-to-peak voltage of the noise component between the passive source circuit and the active filter circuit is smaller than a maximum output voltage and/or current capability of the active filter circuit.

8. An EMI filter according to claim 1,
wherein the bus comprises a first power conductor and a second power conductor; and
wherein at least one capacitance is provided between the first and second power conductors between the input side and the EMI filter, such as to equalize the impedance seen from each power conductors to ground.

9. An electromagnetic interference (EMI) filter for suppressing interferences in a DC network, the network comprising:
a source device powering a load device via a bus connectable to the source device at an input side and to the load device at an output side;
the EMI filter being connected to the bus and comprising an active filter circuit having an active filter bandwidth and being configured to sense a noise component superimposed in the bus at the input side traveling towards the output side and inject a cancelling noise in the bus to suppress said noise component;
wherein the EMI filter further comprises a passive circuit including a passive source circuit connected to the bus at the input side and a passive load circuit connected to the bus at the output side, the passive circuit being configured to provide, at each frequency of the active filter bandwidth, a source impedance at the input side that differs from a load impedance at the output side by a factor of at least two, wherein the passive source circuit includes a n-order passive filter; and wherein n is 2 or greater.

10. An EMI filter according to claim 9,
wherein the passive source circuit comprises a C-L circuit including at least a source capacitance, a source inductance and a source damping resistor.

11. An EMI filter according to claim 10,
wherein the source damping resistor is equal or smaller than 3Ω.

12. An EMI filter according to claim 10,
wherein the passive source circuit comprises a source capacitance of about 1 nF and a source inductance of about 7 µH.

13. An electromagnetic interference (EMI) filter for suppressing interferences in a DC network, the network comprising:
a source device powering a load device via a bus connectable to the source device at an input side and to the load device at an output side;
the EMI filter being connected to the bus and comprising an active filter circuit having an active filter bandwidth and being configured to sense a noise component superimposed in the bus at the input side traveling towards the output side and inject a cancelling noise in the bus to suppress said noise component;
wherein the EMI filter further comprises a passive circuit including a passive source circuit connected to the bus at the input side and a passive load circuit connected to the bus at the output side, the passive circuit being configured to provide, at each frequency of the active filter bandwidth, a source impedance at the input side that differs from a load impedance at the output side by a factor of at least two, wherein the passive load circuit includes at least a single passive component and a load damping resistor.

14. An EMI filter according to claim 13,
wherein the passive load circuit includes a load capacitance of about 20 nF and a load damping resistor of about 1Ω.

* * * * *